(12) United States Patent
Raaijmakers

(10) Patent No.: US 6,383,330 B1
(45) Date of Patent: May 7, 2002

(54) QUARTZ WAFER PROCESSING CHAMBER

(75) Inventor: Ivo Raaijmakers, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/394,372

(22) Filed: Sep. 10, 1999

(51) Int. Cl.⁷ .............................................. H01L 21/00
(52) U.S. Cl. ........................ 156/345; 118/715; 118/725
(58) Field of Search ................................ 118/725, 715; 156/345

(56) References Cited

U.S. PATENT DOCUMENTS

| 3,560,166 A | 2/1971 | Walles |
| 3,598,082 A | 8/1971 | Rice |
| 3,627,590 A | 12/1971 | Mammel |
| 3,744,964 A | 7/1973 | Hart |
| 3,830,194 A | 8/1974 | Benzing et al. |
| 3,956,860 A | 5/1976 | Andrews |
| 4,076,859 A | 2/1978 | Schladitz |
| 4,108,108 A | 8/1978 | Schladitz |
| 4,188,519 A | 2/1980 | Berg |
| 4,512,283 A | 4/1985 | Bonifield et al. |
| 4,533,820 A | 8/1985 | Shimizu |
| 4,539,933 A | 9/1985 | Campbell et al. |
| 4,545,327 A | 10/1985 | Campbell et al. |
| 4,590,024 A | 5/1986 | Lesk et al. |
| 4,770,630 A | 9/1988 | Akimoto et al. |
| 4,803,948 A | 2/1989 | Nakagawa et al. |
| 4,807,562 A | 2/1989 | Sandys |
| 4,821,674 A | 4/1989 | deBoer et al. |
| 4,836,138 A | 6/1989 | Robinson et al. |
| 4,839,145 A | 6/1989 | Gale et al. |
| 4,854,263 A | 8/1989 | Chang et al. |
| 4,886,449 A | 12/1989 | Brittin |
| 4,920,918 A | 5/1990 | Adams et al. |
| 4,920,920 A | 5/1990 | Shigeki |
| 4,924,807 A | 5/1990 | Nakayama et al. |
| 4,958,061 A | 9/1990 | Wakabayashi et al. |
| 4,980,204 A | 12/1990 | Fujii et al. |
| 4,991,540 A | 2/1991 | Jurgensen et al. |
| 4,992,303 A | 2/1991 | Whiffin et al. |
| 4,993,360 A | 2/1991 | Nakamura |
| 4,994,301 A | 2/1991 | Kusumotoa et al. |
| 5,024,182 A | 6/1991 | Kobayashi et al. |
| 5,038,395 A | 8/1991 | Lenski |

(List continued on next page.)

FOREIGN PATENT DOCUMENTS

| JP | 57-198620 | 6/1981 |
| JP | 59-112614 | 6/1984 |
| JP | 59223294 | 12/1984 |

Primary Examiner—Thi Dang
(74) Attorney, Agent, or Firm—Knobbe, Martens, Olson & Bear LLP

(57) ABSTRACT

Described herein is a process chamber with a substantially all-quartz interior surface. The preferred embodiments have upper and lower walls being curved in both the x-z and y-z planes. In one embodiment, the chamber has thin upper and lower dome walls made from a generally transparent material such as quartz, each with a convex exterior surface and a concave interior surface. These walls are joined at their side edges to a cylindrical side wall, preferably formed from a generally translucent material such as bubble quartz. The upper and lower walls and the side wall substantially enclose an all-quartz interior surface, except for apertures used for gas inlet and outlet, wafer intrusion and extraction and wafer retention. An internal reinforcement extends along the entire interior perimeter of the chamber to provide additional strength and support to the chamber. An external reinforcement surrounds the cylindrical side wall to confine outward expansion of the chamber. In another embodiment, the chamber has upper and lower dome walls that are curved along both their longitudinal and lateral axes, the walls being substantially rectangular when viewed from above.

54 Claims, 8 Drawing Sheets

U.S. PATENT DOCUMENTS

| | | |
|---|---|---|
| 5,062,386 A | 11/1991 | Christensen |
| 5,070,814 A | 12/1991 | Whiffin et al. |
| 5,077,875 A | 1/1992 | Hoke et al. |
| 5,085,887 A | 2/1992 | Adams et al. |
| 5,091,219 A | 2/1992 | Monkowski et al. |
| 5,092,728 A | 3/1992 | Crabb et al. |
| 5,096,534 A | 3/1992 | Ozias |
| 5,108,792 A | 4/1992 | Anderson et al. |
| 5,179,677 A | 1/1993 | Anderson et al. |
| 5,228,917 A | 7/1993 | Pawlakowitsch et al. |
| 5,328,722 A | 7/1994 | Ghanayem et al. |
| 5,336,327 A | 8/1994 | Lee |
| 5,348,587 A | 9/1994 | Eichman et al. |
| 5,370,738 A | 12/1994 | Watanabe et al. |
| 5,411,590 A | 5/1995 | Hawkins et al. |
| 5,421,893 A | 6/1995 | Perlov |
| 5,421,957 A | 6/1995 | Carlson et al. |
| 5,455,069 A | 10/1995 | Lee |
| 5,525,157 A | 6/1996 | Hawkins et al. |
| 5,551,982 A | 9/1996 | Anderson et al. |
| 5,685,906 A | 11/1997 | Dietze et al. |
| 6,245,149 B1 * | 6/2001 | de Lomenie et al. ........ 118/725 |

* cited by examiner

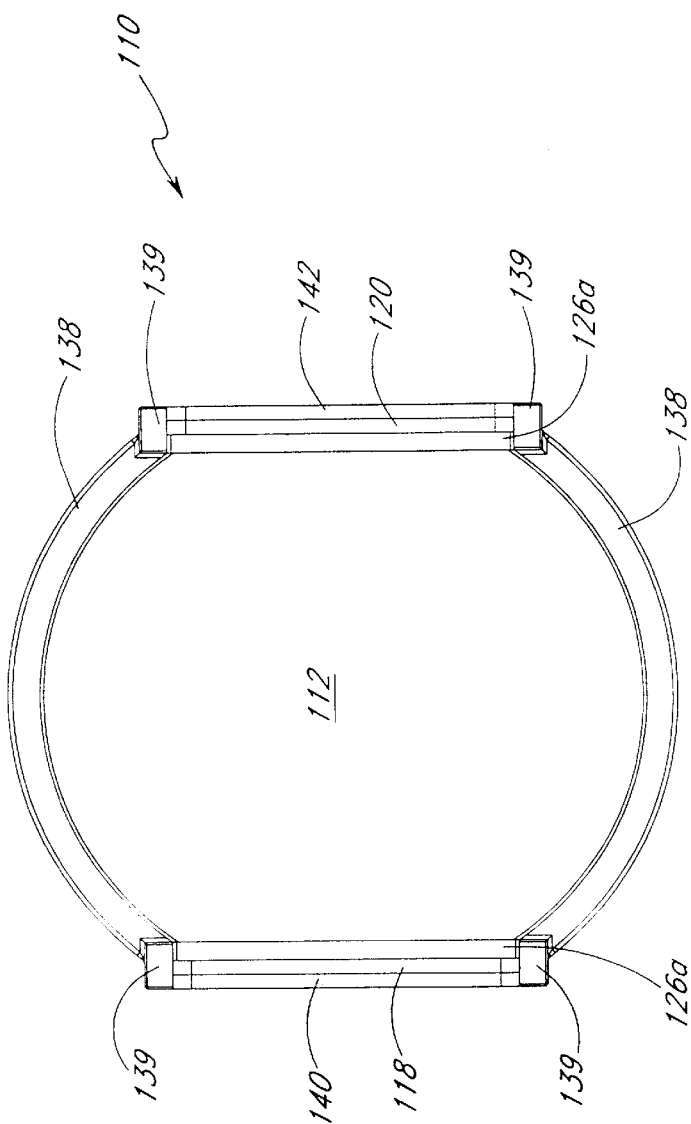
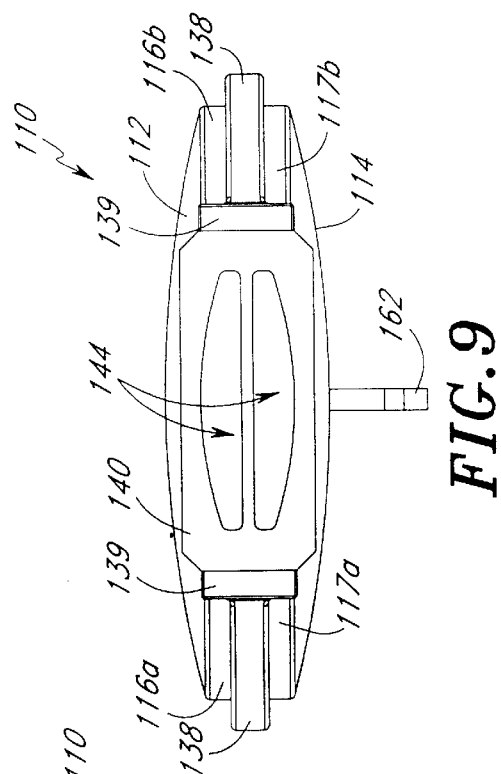
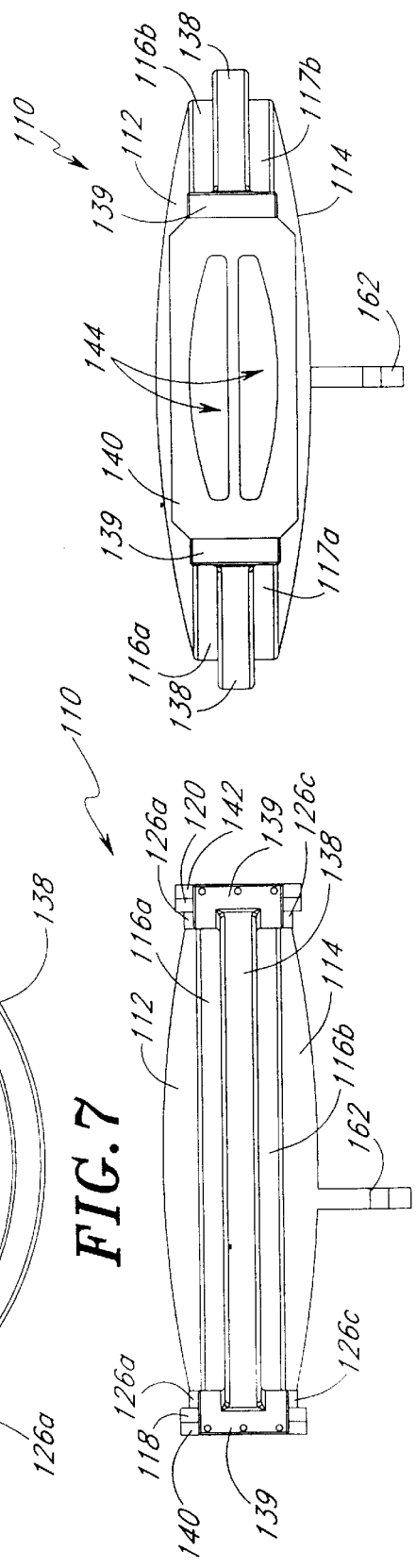
FIG. 7
FIG. 8
FIG. 9

QUARTZ WAFER PROCESSING CHAMBER

BACKGROUND OF THE INVENTION

1. Field of the Invention

This invention relates to reaction chambers for high temperature processing of semiconductor wafers. More particularly, the invention relates to a compact process chamber capable of withstanding stresses associated with high temperature, low pressure processes, and having an improved service life.

2. Description of the Related Art

Reaction chambers used for semiconductor processing generally employ radiant heaters positioned on the exterior of the chamber to heat a wafer located within the chamber. The wafer is typically separated from the heaters by chamber walls, which prevent the release of the processing gases into the ambient environment. These walls are desirably made of a transparent material to allow the radiant heat to pass through the walls and heat only the wafer. This material must also be able to withstand the very high temperatures used in processing semiconductor wafers. In addition, the chamber walls are desirably made from an inert material that does not react with the processing gases at the operative temperature. Furthermore, the material used for the chamber walls desirably has high purity characteristics to minimize contamination of the chamber that impedes the wafer processing. Quartz or a similar material is popular for use in chamber walls for exhibiting the foregoing properties.

For applications in which the pressure within a quartz chamber is to be reduced much lower than the surrounding ambient pressure, cylindrical or spherical chambers have been preferred from a strength standpoint because their curved outward surfaces can aid in withstanding inwardly direct force. A dome-shaped chamber has been described in U.S. Pat. No. 5,085,887, entitled WAFER REACTOR VESSEL WINDOWS WITH PRESSURE-THERMAL COMPENSATION, and in U.S. Pat. No. 5,108,792, entitled DOUBLE-DOME REACTOR FOR SEMICONDUCTOR PROCESSING, both of which have been assigned to Applied Materials, Inc. This chamber includes an upper wall having a convex outer surface and a concave inner surface. A greatly thickened peripheral flange is provided that radially confines the upper wall to cause the wall to bow outward due to thermal expansion, helping to resist the exterior ambient pressure in vacuum applications. The chamber requires a complex mechanism for clamping the thickened exterior flanges of the upper and lower chamber walls. In particular, the flange portion is secured between base plates and clamping plates and is sealed with O-rings.

A problem with double-dome chambers as described above is that such chambers typically have an abundance of metallic surfaces. As noted, the domes of the chambers are sealed to metal base plates and clamping plates through O-rings. These metal plates are necessary to provide the chamber with sufficient strength to prevent the top and bottom domes from bending. A disadvantage of this design is that the metallic surfaces of the plates and the O-rings come into contact with the processing gases and, if not adequately coated, are subject to elevated temperature and low pressure conditions. Specifically, metal found within an IR field absorbs heat, thereby requiring more power to heat the wafer, wafer holder and/or slip ring. Consequently, the metal ring is difficult to cool. Moreover, the O-rings have a tendency to deteriorate when exposed to chemicals at high temperatures. The existence of non-quartz or other non-inert surfaces in contact with the interior of the reaction chamber in close proximity to the wafer may lead to the introduction of contaminants on the wafer by reaction of the surfaces with the processing gases.

A lenticular chamber for processing of semiconductor wafers is described in pending application titled PROCESS CHAMBER WITH INNER SUPPORT, Ser. No. 08/637,616, filed Apr. 25, 1996, now U.S. Pat. No. 6,093,252. This chamber has thin upper and lower curved quartz walls having a convex exterior surface and a concave interior surface. These walls are welded to mate at their side edges to two quartz side rails, thus giving the chamber a generally flattened or ellipsoidal cross-section. The two side rails and an internal quartz plate provided within the chamber prevent the upper and lower walls from bending. End flanges welded to the side rails and upper and lower walls are made from translucent quartz. Thus, the lenticular chamber reduces the amount of metal exposed to the interior of the chamber, as compared to the chambers of the '887 and '792 patents.

Despite these advantages, there are certain disadvantages of the above-described lenticular chamber. For instance, upscaling the lenticular chamber to larger sizes is difficult. The lenticular chamber is rectangular because O-rings located at the longitudinal ends of the chamber should be kept farther away from the center of the chamber where the wafer is located. These O-rings have a tendency to heat up, and therefore, if located too close to the extreme temperatures at the center of the chamber, they will become difficult to cool and may deteriorate more easily due to thermal stresses. Moreover, a rectangular shape is desired for the lenticular chamber to more evenly distribute gas flow through the chamber. By providing a longer longitudinal distance for gas to flow over the wafer to be processed, the gas can spread out in the chamber before reaching the wafer, thereby allowing a more uniform deposition. Therefore, to upscale the design to larger sizes requires maintaining rectangular proportions in the chamber. Also, the non-symmetrical design of the chamber is not favorable to vertical gas flow, for example, when gas flow is provided through an inlet above the wafer.

Such a chamber used to process, for example, 300 mm wafers, would be extremely big and heavy, and difficult to fabricate, requiring special cranes and lifting devices. This increase in size also decreases the amount of clean room space available. Furthermore, the larger size also makes the chamber more difficult to clean.

Accordingly, a need exists for a reaction chamber for semiconductor processing that minimizes the amount of metallic and other heat-absorbing and contaminating materials in the reaction chamber. Desirably, the chamber should be compact and have sufficient strength to be used in low pressure, high temperature environments.

SUMMARY OF THE INVENTION

The above needs are satisfied by the process chambers described hereinbelow. Briefly stated, the preferred embodiments are constructed such that the process chamber has an interior surface of all-quartz or similar material. The chamber has thin upper and lower walls made from a generally transparent material, such as quartz, each preferably having a convex exterior surface and a concave interior surface. These walls are joined at their edges to a side wall or walls, preferably formed from a generally translucent material such as bubble quartz. The upper and lower walls and the side walls substantially enclose an all-quartz interior surface, except for apertures used for gas inlet and outlet and wafer transfer. An internal reinforcement extends from the inner surface of the side wall around the entire internal perimeter of the chamber to provide additional strength and support to the chamber.

As used herein, description of an all-quartz interior chamber surface refers to the enclosing surfaces of the chamber, such as the upper and lower walls and side wall, and not to the fixtures such as the slip ring and susceptor found inside the chamber. The illustrated all-quartz construction minimizes the metallic and non-quartz surfaces in the chamber, thereby making the chamber easier to cool and requiring less power consumption to heat the wafer and slip ring located inside the chamber. The use of substantially all-quartz surfaces also reduces contaminants within the chamber and alleviates fracturing of non-quartz parts due to the high temperature, low pressure environment. In one embodiment, the chamber also has a generally cylindrical, double-dome like shape so that it can be made smaller than rectangular chambers used for processing the same wafer size. This shape also provides better strength to the chamber while enabling either transverse and/or axial gas flow for a more uniform deposition.

In one aspect of the present invention, a processing chamber is provided comprising an upper wall having a convex outer surface and a concave inner surface. A lower wall is spaced from the upper wall having a convex outer surface and a concave inner surface. Both the upper wall and the lower wall extend a length in a y dimension, a width in an x dimension and a height in a z dimension. Both these walls are curved in both x-z and y-z planes. At least one side wall having an inner surface and an outer surface connects the upper wall to the lower wall, wherein the upper wall, lower wall and the at least one side wall together substantially enclose a chamber space having all-quartz enclosing surfaces. An external reinforcement is provided on at least part of the outer surface of the at least one side wall to confine outward expansion of the chamber.

In another aspect of the present invention, the processing chamber comprises a quartz upper dome wall and a quartz lower dome wall spaced from the upper dome wall. Each dome wall has a convex outer surface and a concave inner surface. A generally cylindrical quartz side wall having an inner surface and an outer surface connects the upper and lower dome walls and defines a chamber space therebetween. A retainer surrounds at least a portion of the outer surface of the side wall to confine outward expansion of the chamber. The chamber space is substantially enclosed only by the inner surfaces of the dome wall and the inner surface of the side wall.

In another aspect of the present invention, a processing chamber having an upstream end and a downstream end and lateral sides extending therebetween is provided. The chamber comprises an upper wall and a lower wall spaced from the upper wall, each wall being outwardly curved in both a lateral and a longitudinal direction. A plurality of side walls connects the upper and lower walls. The plurality of side walls includes an inlet flange connecting the upper and lower walls at the upstream end of the chamber, an outlet flange connecting the upper and lower walls at the downstream end of the chamber, and side rails connecting the upper and lower walls at the lateral sides of the chamber and connecting the inlet and outlet flanges between the upstream and downstream ends of the chamber. An external reinforcement is provided along at least a portion of the plurality of side walls to confine outward expansion of the chamber. The chamber has a substantially all-quartz interior surface defined by the upper and lower walls and the plurality of side walls.

In another aspect of the present invention, a chamber for processing semiconductor wafers and the like is provided. The chamber comprises outwardly convex upper and lower walls each having outer and inner surfaces and being curved in a lateral and a longitudinal direction. At least one side wall connects the upper and lower walls, the at least one side wall having inner surfaces that are substantially flush with the inner surfaces of the upper and lower walls at the connection between the edges of the at least one side wall and the upper and lower walls. The upper and lower walls and the at least one side wall enclose a chamber space having a substantially continuous inner surface formed of a nonreactive substantially light-transmissive material.

In another aspect of the present invention, the processing chamber comprises an upper wall and a lower wall that are both curved in x-z and y-z planes. At least one side wall connects the upper and lower walls such that the at least one side wall and the upper and lower walls confine a chamber space. A reinforcement extends along the entire interior perimeter of the chamber space to prevent outward expansion of the chamber.

In another aspect of the present invention, a processing chamber is provided having an upstream end and a downstream end defining a longitudinal axis of the chamber, and a lateral axis perpendicular to the longitudinal axis. The chamber comprises outwardly curved upper and lower walls, each wall being substantially rectangular when viewed from above. Each wall is outwardly curved along both its longitudinal and lateral axes. Side walls connect the upper and lower walls.

In another aspect of the present invention, a processing chamber having an upstream end and a downstream end and lateral sides extending therebetween is provided. An upper wall extends a length in a y dimension between the upstream and downstream ends, a width in an x dimension between the lateral sides, and a height in a z dimension. A lower wall also extends a length in the y dimension, a width in the x dimension, and a height in the z dimension. The upper wall and the lower wall each has a substantially convex outer surface and is formed of a substantially non-reactive light transmissive material. At least one side wall connects the upper wall to the lower wall to define a chamber space therebetween. The at least one side wall thereby defines an outer periphery of the chamber space and is formed of a substantially non-reactive light transmissive material. An external reinforcement extends substantially entirely around the outer periphery of the chamber space to confine outward expansion of the chamber.

BRIEF DESCRIPTION OF THE DRAWINGS

FIG. 7 is a top elevation view of the process chamber of FIG. 5.

FIGS. 8 and 9 are side views of the process chamber of FIG. 5.

DETAILED DESCRIPTION OF THE PREFERRED EMBODIMENTS

1. First Preferred Embodiment

Figure 1:
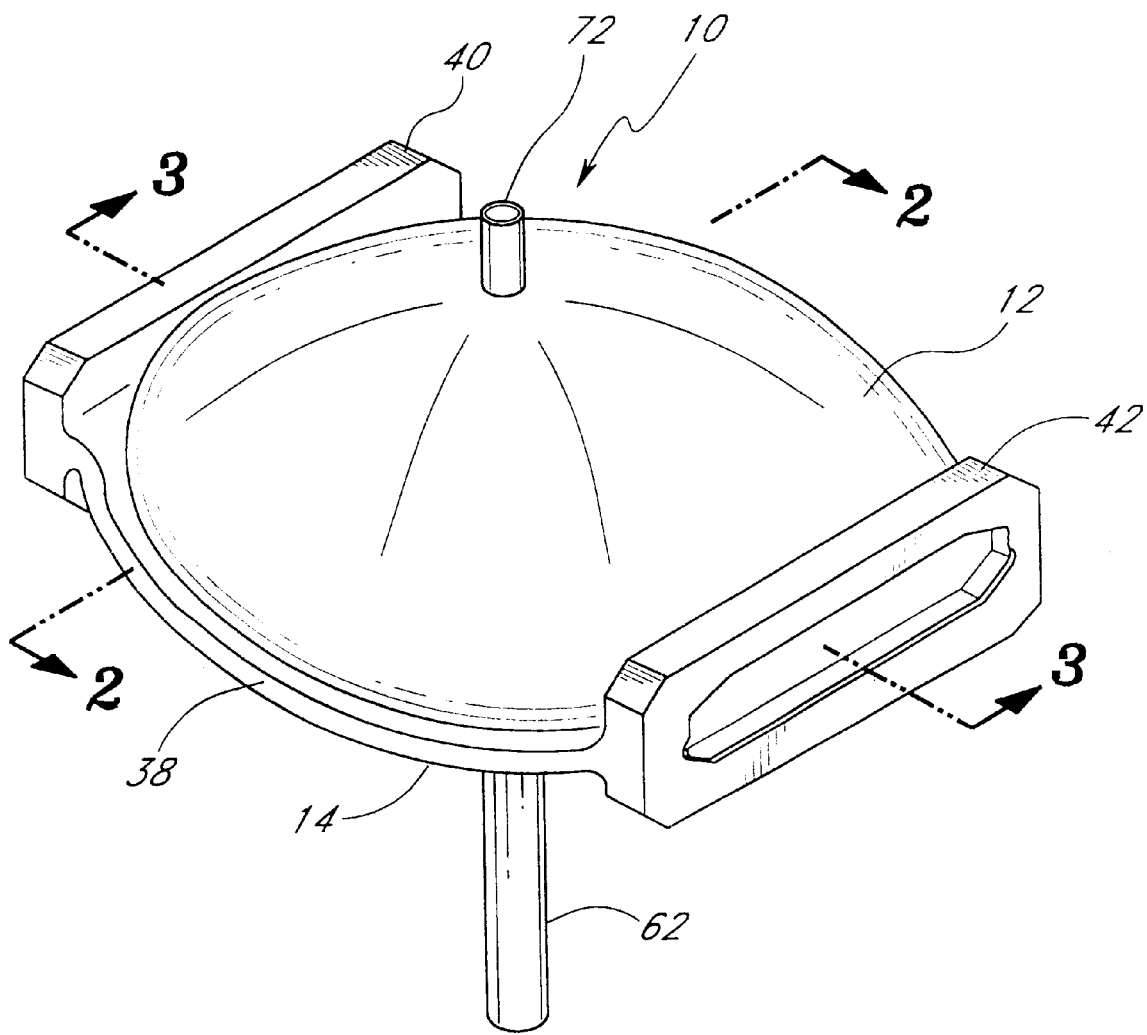
FIG. 1 is a perspective view of a process chamber constructed in accordance with a first embodiment of the present invention.
Figure 2:
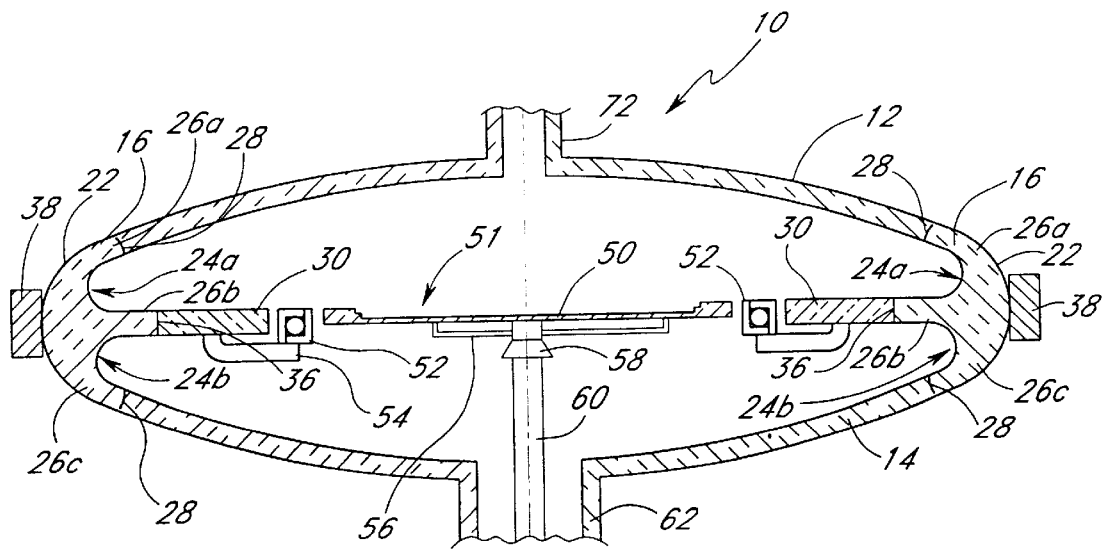
FIG. 2 is a cross-sectional view of the process chamber, taken along lines 2—2, of FIG. 1.
Figure 3:
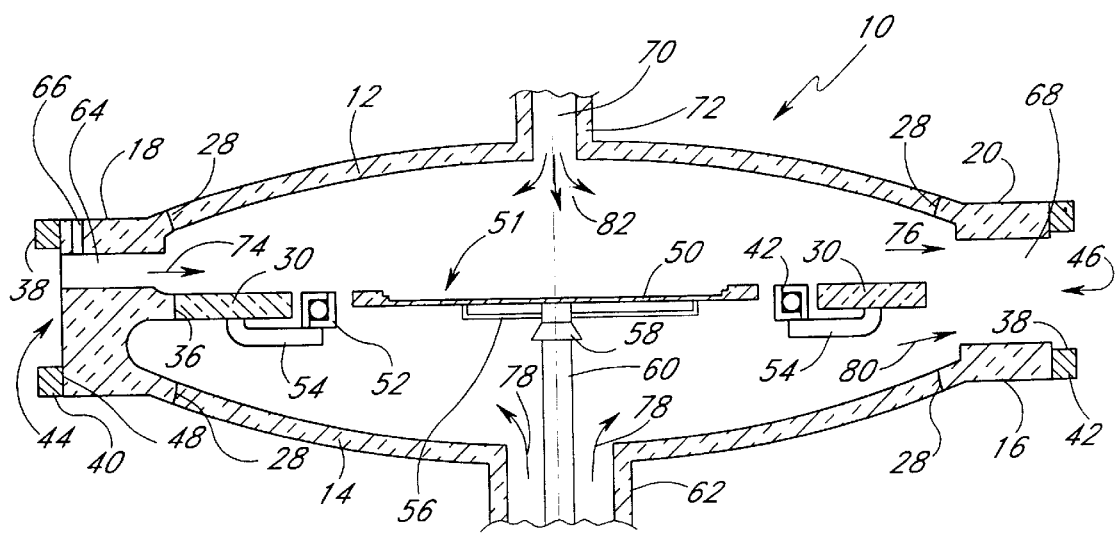
FIG. 3 is a cross-sectional view of the process chamber, taken along lines 3—3, of FIG. 1.

Referring generally to FIGS. 1–4, one preferred embodiment of a reactor vessel or processing chamber 10 for chemical vapor deposition, etching, annealing and the like is illustrated. As can be seen, upper wall 12 is has an outwardly curved shape and has a generally circular cross-section when viewed from above. With reference to FIGS. 2 and 3, the chamber 10 includes an upper quartz dome wall 12 with an outer convex surface and an inner concave surface, and a lower quartz dome wall 14 with an outer convex surface and an inner concave surface. The dome walls are connected by a side wall 16 which extends around the circumference of the chamber 10 and is attached to the rims of the upper and lower walls. The side wall 16 includes an upstream inlet flange 18 and a downstream outlet flange 20. Upstream and downstream relate to the direction of process gas flow, as will be described, and are synonymous in the present description with front and rear. An external reinforcement or retainer 38 is optionally provided surrounding the side wall 16, as will be described below.

The chamber height is preferably less than the chamber diameter. In this respect, a longitudinal or y direction for the chamber 10 extends from the inlet flange 18 to the outlet flange 20, or along section line 3—3. A lateral or x direction extends perpendicular to the longitudinal direction, or along section line 2—2. The height or z direction is perpendicular to both the longitudinal and lateral axes.

As shown in FIGS. 2 and 3, within the chamber 10, an interior reinforcement 30 extends from the side wall 16 to provide additional support to the chamber. A wafer holder or susceptor 50 is supported on rotating shaft 60, which extends through a tube 62 depending from lower wall 14. A temperature compensation or slip ring 52 surrounds the susceptor 56 within an opening defined by the reinforcement 30. Horizontal, laminar gas flow is provided from the upstream end of the chamber 10 at inlet flange 18, as directed through gas inlet 66 and slot 64. An alternative or secondary gas inlet 70 is provided from the upper wall 12 of the chamber 10 to enable axial gas flow.

With these general design principles in mind, further details regarding the first preferred embodiment are presented below.

Chamber Walls

Figure 4:
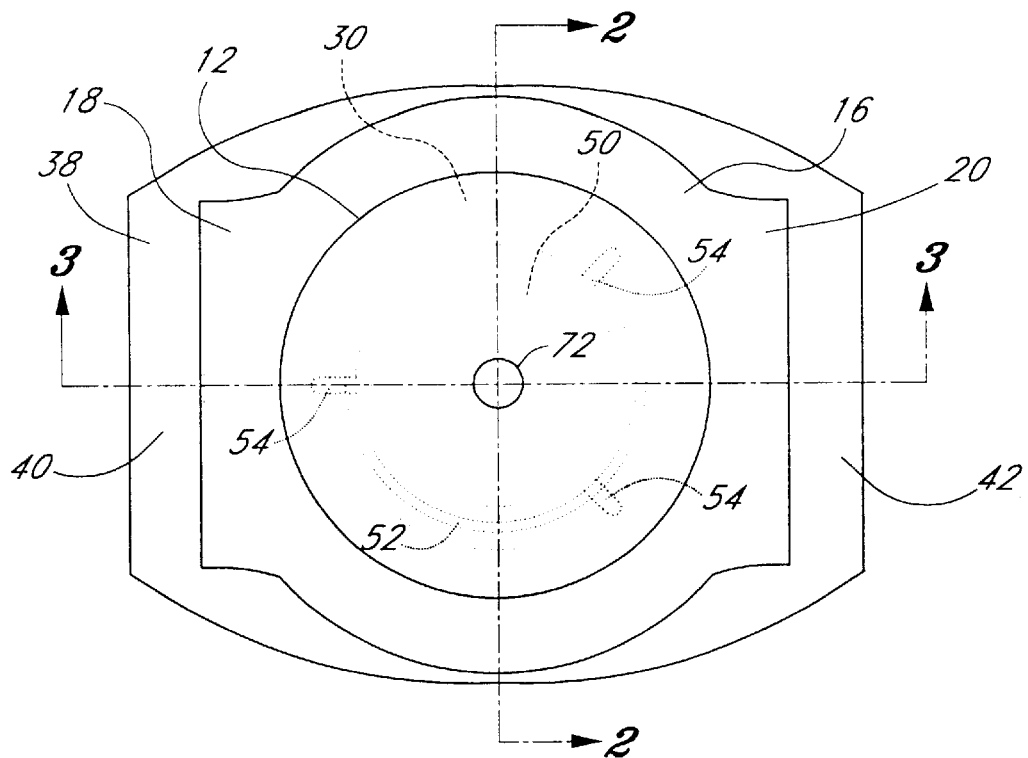
FIG. 4 is a top schematic view of the process chamber of FIG. 1, showing the orientation of the chamber components.
Figure 5:
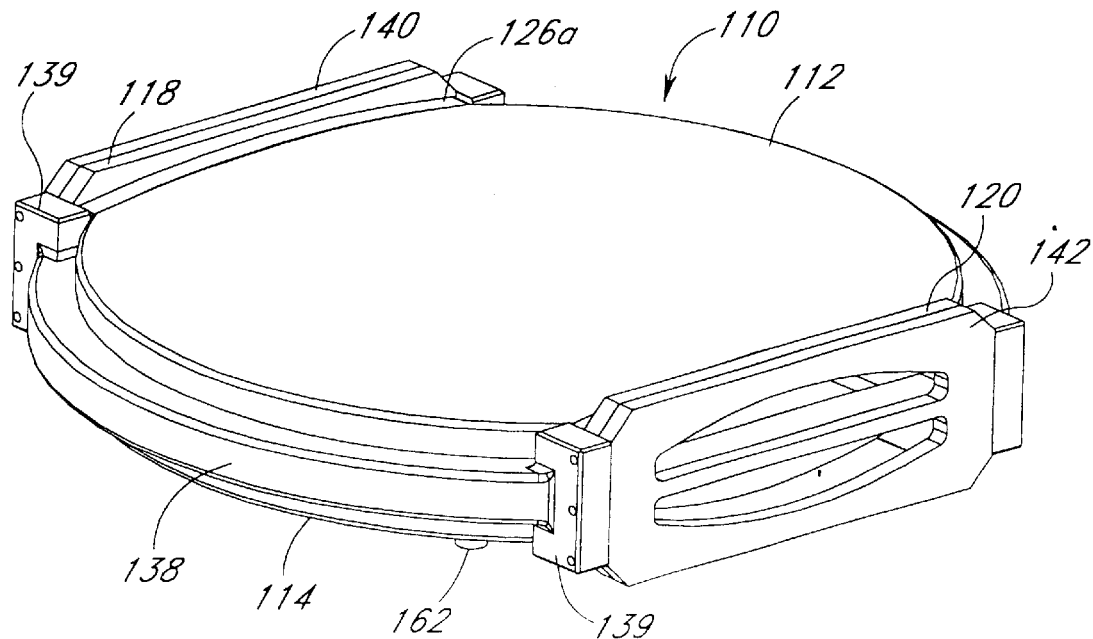
FIG. 5 is a perspective view of a process chamber constructed in accordance with a second embodiment of the present invention.

The upper wall 12 and lower wall 14 of the chamber 10 are preferably formed a material resistant to thermal stress and transparent to certain ranges of radiant energy. More preferably, the upper and lower walls are made from a transparent quartz material. In the preferred embodiment, the inner and outer surfaces of these walls are curved in both the lateral and longitudinal dimensions, i.e., in both the x-z and y-z planes. More preferably, the upper and lower walls have an outward curvature in substantially all of the planes parallel to the z-axis of the chamber, thereby giving the walls the dome-like shape as illustrated. As shown in FIG. 4, these walls appear circular when viewed from above. The walls preferably have a convex outer surface and a concave inner surface. The upper and lower walls 12 and 14 of the chamber 10 are preferably constructed by hot forming and/or machining. In larger chambers, the walls 12 and 14 may be constructed from flat plates that are subsequently heated and formed.

It will be appreciated that other shapes may be used for the walls 12 and 14. Furthermore, while the upper and lower walls are preferably symmetrical, walls of different dimension with differing radii of curvature may also be used. It is conceivable as well that only the outer surfaces of the upper and lower dome walls be curved, or that one of the walls have no curvature at all.

As shown in FIGS. 2 and 3, the side wall 16 includes a reinforced main body having preferably a substantially cylindrical outer surface 22 which is curved to form a continuation of the curved outer surfaces of the upper wall 12 and the lower wall 14. The side wall 16 thus extends circumferentially around the interior of the chamber 10, connecting to the rims of the upper dome wall 12 and lower dome wall 14. At the inlet and outlet ends of the chamber 10, the side wall 16 is rectangularly shaped, as shown in FIGS. 3 and 4, to define inlet and outlet flanges 18, 20, respectively, having apertures for wafer transfer and gas inlet and outlet, described in further detail below. The inner surface of the side wall 16 is formed with longitudinally extending upper and lower recesses 24a, 24b, that create upper, middle and lower stub wall segments 26a, 26b and 26c, respectively. The upper and lower stub wall segments 26a, 26c mate with the side edges of the upper and lower walls 12 and 14 at longitudinal weld joints 28 to form substantially flush surfaces therebetween.

The side wall 16 is preferably translucent and fabricated from quartz having nitrogen bubbles dispersed therein. The translucent side wall 16 scatters radiant energy to reduce "light-piping" therethrough. This protects O-rings and other parts outside the chamber from exposure to extreme temperatures generated within the chamber. The side wall 16 is preferably constructed by machining.

As seen in FIG. 2, the upper and lower walls 12, 14 are preferably thin plates having an outward convex configuration. In one embodiment, to process a wafer with a diameter of 200 mm, these walls 12 and 14 preferably have a thickness of about 5 mm. Accordingly, because stub wall segments 26a and 26c of the side wall 16 mate with the upper and lower walls 12 and 14, respectively, these stub segments in this embodiment also have a thickness of about 5 mm. Between the stub segments 26a and 26c, the side wall 16 increases in thickness to provide strength and support to the chamber and to resist outward expansion of the upper and lower walls. The central stub segment 26b extending towards the interior of the chamber preferably has a thickness greater than that of the stub segments 26a and 26b and walls 12, 14, and for the exemplary embodiment, is about 10 mm.

In the illustrated embodiment, the upper and lower dome walls 12 and 14 each preferably has a constant radius of curvature of about 50 to 100 cm, thereby giving the walls a substantially curved shape. These walls are spaced apart by the side wall 16 which preferably has a height of about 5 cm, an inner diameter of about 40 cm and an outer diameter of about 50 cm.

The dimensions for the chamber will obviously be modified for larger size wafers. For example, the present chamber invention is suitable for processing wafers having diameters of 200 mm, 300 mm and even larger. Preferably, the relative cross-sectional dimensions will remain the same, and thus a larger diameter chamber to accommodate 300 mm wafers will have a larger height. The increased height in the chamber for 300 mm wafers will necessitate certain modifications to other subsystems, such as radiant heat lamps disposed around the chamber for heating the susceptor and wafer, described below. In short, although the surrounding environments for processing 200 mm and 300 mm diameter wafers may necessarily differ in certain respects, these differences are within the skill of one practiced in the art of process chamber construction and operation. The particular dimensions are, of course, given merely by way of example.

As described above, the upper and lower walls of the chamber 10 in the first preferred embodiment are constructed entirely out of a light-transmissive material such as quartz. the side wall is preferably made from bubble quartz to minimize heat losses. Thus, the upper wall 12, lower wall 14, and side wall 16 enclose a chamber space having a substantially all-quartz interior surface except for apertures for wafer transfer and gas inlet and outlet. Quartz is the preferred material for the dome walls and the side wall because of its transparency and temperature resistance to the radiant lamps used to heat the wafers. An all-quartz configuration is also much easier to cool than a chamber which contains non-quartz components. In addition, quartz is a nonreactive material that does not degrade easily. Other materials may react with the gases introduced into the chamber, thereby producing contaminants while creating structural problems in these non-quartz components. Although quartz is preferred, other materials having similar desirable characteristics may be substituted. Some of these desirable characteristics include a high melting point, the ability to withstand large and rapid temperature changes, chemical inertness, and high transparency to light.

Inner Chamber Support

As shown in FIGS. 2 and 3, an internal reinforcement 30 is provided within the chamber 10. In the preferred embodiment, the internal reinforcement is a support plate which mates with stub wall segment 26b at longitudinal weld joint 36. The support plate therefore extends entirely around the internal circumference of the chamber. The support plate 30 preferably has the same thickness as stub 26b to form substantially continuous or flush surfaces therebetween. Therefore, in the exemplary embodiment described above, both the support plate 30 and the wall segment 26b have the same thickness of about 10 mm.

The support plate 30 is preferably formed of the same material used to form the side wall 16 and is constructed by machining. The support plate 30 is preferably made from quartz. The plate 30 provides additional strength and support to the chamber 10 because, by extending from or being fixed to the inner surface of the side wall 16, the plate confines the outward expansion of the side wall 16 during low pressure applications. Furthermore, by constructing this plate from a material such as quartz, this plate will not heat excessively during processing or react or cause contamination to the chamber. While the preferred embodiment has been described as having a support plate 30 separate from the side wall 16, alternatively, the support plate 30 and the side wall 16 can be molded or machined from a single piece of quartz.

More preferably, the support plate 30 forms an annular ring defining a central aperture or opening. This opening allows for placement of the susceptor and related structures, described below. The central stub 26b preferably precisely bisects the upper and lower walls 12 and 14, and the support plate 30 thus lies on the centerline or center plane therebetween. This desirable location creates stresses only within the plane of the plate 30 imposed by lateral displacement of the side wall 16. Such displacement occurs in reduced pressure processing as the walls 12, 14 tend to flatten out and exert lateral and longitudinal tension stresses on the plate 30. By designing this symmetry, the support plate undergoes no significant bending or shear stresses and is able to thus withstand greater overall normal stresses.

During use, pressure differentials between the interior of the chamber 10 and the outside ambient pressure create stresses in both the upper and lower walls 12, 14 and the side wall 16. The laterally inward and outward movement of the side wall 16 is restricted by its fixed attachment to the annular support plate 30. In vacuum processing, as mentioned above, the walls 12, 14 will attempt to flatten out which imparts generally outward forces on the side wall 16. The support plate 30 is placed in tension and restricts outward displacement of the side wall 16.

In the illustrated embodiment, the support plate 30 preferably has a diameter of about 400 mm for a processing chamber sized to process a 200 mm wafer. The opening in the support plate preferably has a diameter of about 240 mm. The support plate preferably has a thickness of about 5 mm to mate with the central stub segment 26c.

Retainer

In the embodiment shown in FIGS. 1–4, the quartz side wall 16 is surrounded by a retainer 38, which confines expansion of the chamber due to pressure differential forces. The presence of the retainer 38 enables the quartz side wall 16 to remain relatively thin while giving the chamber sufficient support for low pressure applications. Furthermore, by providing the retainer 38 on the exterior of the chamber 10, the enclosing inner surfaces of the chamber may all be constructed of a quartz or similar material without exposing the material used for the retainer to the interior of the chamber.

The retainer 38 is preferably in the shape of a ring surrounding the side wall 16, although other shapes may be used to confine the side wall 16. The retainer 38 is preferably made of a material having a high elastic modulus and high tensile strength, for example, stainless steel, aluminum alloys, or titanium alloys. The retainer 38 may made of multiple pieces which are mechanically or otherwise joined to surround the side wall 16.

As seen in FIG. 4, when viewed from above, the retainer 38 extends around the side wall 16 and is thicker adjacent the front and rear flanges 18 and 20 of the side wall 16 relative to the lateral edges. More particularly, as seen in FIG. 1, the retainer 38 includes two end flanges 40 and 42. These end flanges preferably comprise generally rectangular slabs having chamfered corners. As seen in FIG. 3, the front flange 40 includes a first opening 44 to allow for wafer insertion. The outlet flange 42 of retainer 38 has a second opening 46 opposite the first opening 44 to allow for gas exhaust, as described in further detail below. In the illustrated embodiment, the retainer 38 preferably has a dimensions varying from about 20 mm (height) ×10 mm (width) at the lateral sides of the chamber to about 50 mm (height)× 30 mm (width) at the end flanges 40 and 42.

Susceptor and Related Structures

Within the chamber 10, the opening within the support plate 30 is dimensioned to receive a susceptor 50, as illustrated in FIGS. 2 and 3, and a temperature compensation or slip ring 52 which surrounds the susceptor 50. The susceptor 50 is adapted to rotate within the stationary ring 52 and is preferably spaced therefrom across a small annular gap. The shape of aperture in the support plate 30 surrounding the ring 52 is made circular so that the edges of the opening would be in close proximity to the ring to avoid and minimize process gas leakage to the lower portion of the chamber. However, the aperture may also have rectangular or other shapes.

As seen from FIGS. 3 and 4, the temperature compensation ring 52 is supported by three elbow-shaped support elements 54 having vertically extending portions being welded to the support plate. More specifically, support elements or fingers 54 are welded to the underside of support plate 30 approximately 120° apart, and the horizontal portion of each element extends into the opening within the support plate 30 positioned under the leading edge of the temperature compensation ring 52. The compensation ring 52 is thus supported in a horizontal plane at three points by upstanding pins (not shown) in the fingers 54. The pins may eventually deteriorate from repeated thermal cycling and exposure to process and etch gases, but they can be replaced fairly easily.

The susceptor 50 is shown supported on arms 56 of a suitable support 58 connected to the upper end of a rotatable shaft 60 that extends through a tube 62 depending from the bottom wall of the chamber. The susceptor 50 is shown approximately level with the upper edge of the ring 52 and the upper surface of the support plate 30. The susceptor 50 includes a pocket 51 to receive a wafer above the susceptor 50 in the upper portion of the process chamber 10, flush with the ring 52.

Preferably, the susceptor 50 and temperature compensation ring 52 are constructed of graphite or silicon carbide or other such high heat absorbency material. The ring 52 provides several advantages in the processing environment, primarily reducing edge heat losses from the susceptor 50. More specifically, the ring 52 closely surrounds the edge of the susceptor 50 and is maintained at a similar temperature during processing, as the materials are similar. The ring thus reduces the temperature differential near the wafer edge to effectively reduce disproportionate edge losses therebetween. Another advantage of the temperature compensation ring 52 is preheating and post heating of the reactant gas in the region of the wafer. Specifically, the reactant gas enters the chamber at an ambient, non-reacting temperature and is heated to a temperature suitable for deposition as it passes over the susceptor and wafer. The surrounding temperature compensation ring 52 thus preheats the reactant gas stream before it reaches the leading edge of the susceptor, and, subsequently, the leading edge of the wafer. The process gas thus reaches an approximately steady state temperature before traveling over the edge of the wafer. Additionally, the temperature of the gas does not significantly drop after passing the downstream edge of the wafer as the temperature compensation ring 52 extends the downstream heating region. Further details regarding the susceptor and related structures are described in assignee's copending application entitled PROCESS CHAMBER WITH INNER SUPPORT, application Ser. No. 08/637,616, filed Apr. 25, 1996, now U.S. Pat. Nos. 6,093,252, and 4,821,674, both of which are incorporated by reference in their entirety.

Wafer Processing and Gas Flow

A wafer processed in the chamber 10 is preferably heated by radiant heat lamps (not shown) surrounding the chamber 10. As shown in FIG. 3, the chamber 10 of the preferred embodiment has a horizontally elongated slot 64 extending through side wall 16 through which a wafer may be inserted. A vertically elongated inlet 66 is also provided through side wall 16 for introducing process gases into the upper portion of the chamber after an isolation valve leading from the slot 64 to a wafer handling chamber (not shown) has been closed. Alternatively, the vertical slit for gas inlet may be provided in the retainer 38. Correspondingly, the opening 44 in retainer 38 described above, allows for wafer inlet through the opening 44 into slot 64 and into the chamber 10.

The outlet portion of the chamber 10, specifically the outlet flange 42, is adapted to mate with an outlet component (not shown) for exhausting process gas from the chamber 10, as well as applying a vacuum to the chamber. As can be seen in FIG. 3, the outlet flange 20 is open to the lower portion of the chamber through the opening 46, which connects with an opening 68 in the side wall 16a in outlet flange 20. Further details describing the inlet and outlet components and other aspects of the wafer processing are described in assignee's copending application entitled PROCESS CHAMBER WITH INNER SUPPORT, application Ser. No. 08/637,616, filed Apr. 25, 1996, now U.S. Pat. No. 6,093,252, the entirety of which is hereby incorporated by reference.

The gas flow through the chamber 10 from inlet 66 is shown in FIG. 3. Reactant gas enters through the inlet slot 64 with a predetermined lateral velocity profile, such as the profile described in U.S. Pat. No. 5,221,556, which is hereby expressly incorporated by reference in its entirety. The reactant gas continues longitudinally rearward as indicated by arrow 74 and exits through the outlet 68 shown by arrow 76, and downward through exhaust conduits (not shown). Typically, purge gas is supplied upward through the hollow tube 62 surrounding the shaft 60, the tube being sized to provide a gas passage surrounding the shaft. The purge gas enters the lower portion of the chamber 10 as indicated by arrows 78. The purge gas prevents unwanted deposition of particulates underneath the susceptor 50 and exits through the longitudinal aperture 68 in the outlet flange 20, as indicated by arrow 80. The purge gas then mixes with the spent reaction gas and continues down through the exhaust conduits (not shown).

The chamber 10 of the preferred embodiment contains two inlets for gas flow. In addition to the inlet 66, a second gas inlet 70 extends from a tube 72 in the upper dome wall 20 to provide another means for introducing gas into the chamber. Gas may alternatively or secondarily be introduced to the chamber 10 through inlet 70 in upper wall 12. The gas introduced through inlet 70 may serve as the primary or an additional source of processing gas to advantageously allow axial gas flow. Once gas enters the chamber 10, arrows 82 indicate the distribution of gas over a wafer (not shown). Because of the circular configuration of chamber 10, introducing processing gases from the top of the chamber directly over a wafer enables a uniform deposition. Thus, the provision of two gas inlets in the preferred chamber design advantageously allows for both cross gas flow and/or axial gas flow.

2. Second Preferred Embodiment

Figure 6:
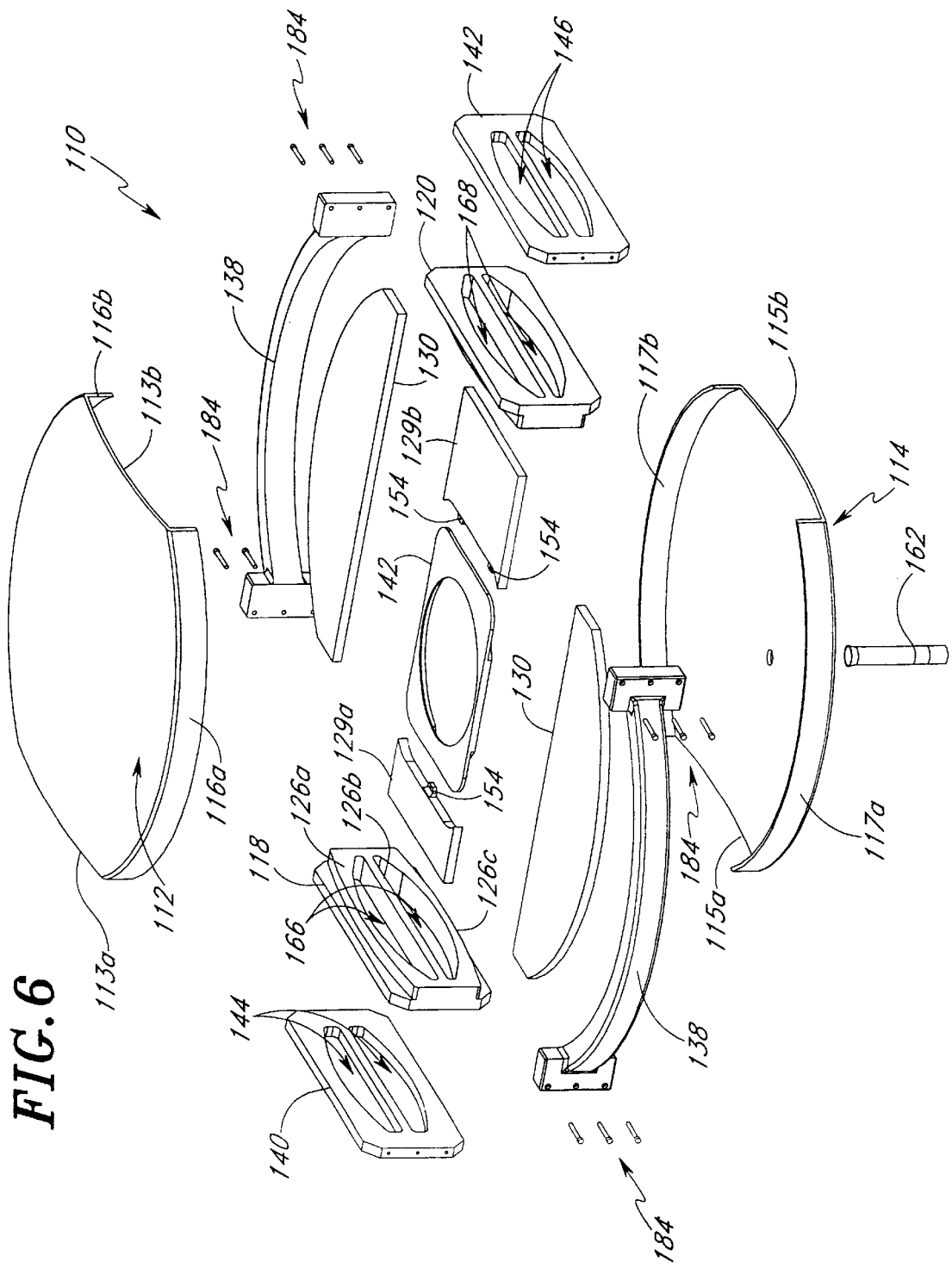
FIG. 6 is an exploded perspective view of the process chamber of FIG. 5.
Figure 10:
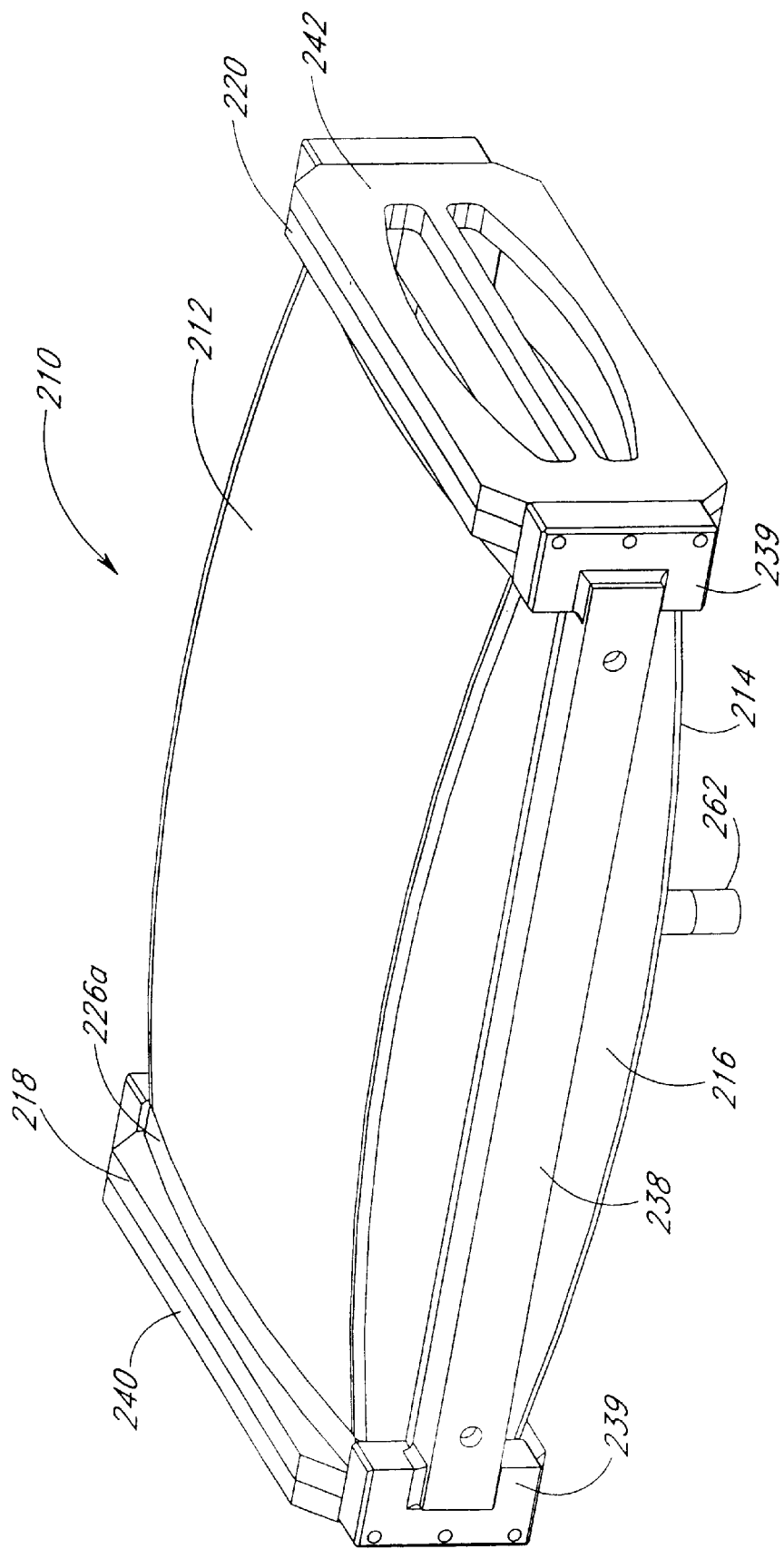
FIG. 10 is a perspective view of a process chamber constructed in accordance with a third embodiment of the present invention.

FIGS. 5–9 illustrate a process chamber 110 according to a second preferred embodiment of the present invention. The chamber of the second preferred embodiment is similar to the first preferred embodiment, in that it has a substantially all-quartz interior surface and similar wafer processing gas flow characteristics, with the structural differences noted below. As with the first embodiment, the chamber has upper and lower walls which are curved in x-z and y-z planes. More preferably, the chamber has a substantially double dome-like configuration which, when viewed from above as in FIG. 7, has a generally circular cross-section. It will be appreciated that the chamber may also be constructed to have elliptical or other shapes when viewed from above. The chamber 110 includes an upper quartz dome wall 112 with an outer convex surface and an inner concave surface, and a lower quartz dome wall 114 with an outer convex surface and an inner concave surface. The lower dome wall further includes a tube 162 extending therefrom used to rotate a susceptor, such as described above. As shown from above in FIG. 7, although the dome walls have a generally circular configuration, the rims of the dome walls 112 and 114 preferably have substantially straight edges 113a, 113b and 115a, 115b (see FIG. 6), at the upstream and downstream ends of the chamber, respectively. It should be appreciated, however, that these edges only appear straight when viewed from above, and are preferably curved in the vertical dimension as shown in FIG. 6 due to the outer convex shape of the dome walls.

As shown in FIG. 6, the chamber 110 includes a plurality of side walls connecting the upper and lower walls 112 and 114 to enclose the chamber. Along the curved lateral sides of each of the dome walls 112 and 114, upstanding quartz side rails 116a, 116b and 117a, 117b, respectively, are provided to enclose the lateral sides of the chamber 110. When the chamber 110 is assembled, side wall 116a is welded to side wall 117a, and side wall 116b is welded to side wall 117b, thereby substantially enclosing the lateral sides of the chamber with all-quartz surfaces. The chamber side walls further include an inlet flange 118 and an outlet flange 120 defining the upstream and downstream ends of the chamber, respectively. Both of these flanges are preferably made from bubble quartz, although other similar materials may be used as well.

Each of the inlet and outlet flanges 118 and 120 are preferably rectangular blocks having chamfered corners. More particularly, the inner surfaces of the inlet and outlet flanges contain upper, middle and lower segments 126a, 126b and 126c, respectively, defining apertures 166 and 168 therebetween for wafer and gas inlet and outlet. The upper segment 126a is curved to mate with the side edges 113a and 113b of the upper dome wall 112. Correspondingly, the lower segment 126c is curved to mate with the side edges 115a and 115b of the lower dome wall 114. These segments are preferably joined to the dome walls by welding. The middle segment 126b preferably bisects the upper and lower walls 112 and 114.

As shown in FIG. 6, within the chamber 110, interior reinforcements are provided in the form of reinforcement plates 129a, 129b and 130. These support plates together preferably extend completely around the internal circumference of the chamber to provide continuous support to the internal circumference of the chamber. The plates are preferably positioned to define an aperture within the plates for positioning of a susceptor (not shown) and slip ring 142 therein. The slip ring 142 is preferably supported on elbows 154. The susceptor and related support structure are similar to that described in the first preferred embodiment above.

More particularly, a substantially rectangular support plate 129a is preferably provided at the upstream end of the chamber and mates with middle segment 126b, preferably welded thereto. A similar downstream plate 129b is preferably welded to middle segment 126b of the outlet flange 120. Plates 130 are preferably provided along the lateral sides of the chamber, each having a substantially semicircular shape to mate with the shape of the side walls 116a, 117a, 116b, and 117b. These support plates 120 are preferably welded to the upper and lower dome walls 112 and 114, and are also preferably welded to the upstream and downstream support plates 129a and 129b. As can be seen in FIG. 6, the downstream plate 129b is preferably sized to be larger than the upstream plate 129a, such that the aperture between the plates is centered closer to the upstream end of the chamber. The advantage of this type of arrangement is that it reduces the rate of devitrification at the upstream edge of the support plate 129a. It should be appreciated, however, that the support plates 129a and 129b may be symmetrical as well.

In the preferred embodiment, the support plates 129a, 129b and 130 are made from a transparent material such as quartz. The plates together provide additional strength and support to the chamber 110 because, by extending from or being fixed to the inner surface of the side walls and inlet and outlet flanges, the plates confine the outward expansion of the chamber 110 during low pressure applications. Furthermore, by constructing these plates from a material such as quartz, the plates will not heat excessively during processing or react or cause contamination to the chamber.

In the embodiment shown in FIGS. 5–9, the quartz side rails 116a, 116b, 117a, 117b, as well as the inlet flange 118 and outlet flange 120, are surrounded by a retainer which confines expansion of the chamber stemming from pressure differential forces. More preferably, the chamber 110 comprises retaining beams 138 provided on the lateral sides of the chamber, and retaining end flanges 140 and 142, respectively, to confine the inlet and outlet flanges 118 and 120. The retaining beams 138 are preferably curved to correspond to the shape of the side walls 116a, 116b, 117a and 117b. At the upstream and downstream ends of these beams are flanges 139 adapted to connect with the upstream and downstream retainer flanges 140 and 142. In the preferred embodiment shown in FIG. 6, the beams 138 are attached to the flanges 140 and 142 using screws 184. However, the skilled artisan will readily appreciate that other joining methods may be used as well.

As above, the retainer components 138, 140 and 142 are preferably made of a material having a high elastic modulus and high tensile strength, for example, stainless steel, aluminum alloys, or titanium alloys. Preferably, the inlet and outlet retainers 140 and 142 are substantially rectangular in shape with chamfered corners to correspond to the shape of the inlet and outlet flanges 118 and 120. The retainer also preferably has apertures 144 and 146 corresponding with the apertures 166 and 168 in the inlet flange 118 and outlet flange 120, respectively, for gas and wafer inlet and outlet. Wafer processing and gas flow characteristics are similar to the embodiment described above and have been described in the above-referenced PROCESS CHAMBER WITH INNER SUPPORT.

The chamber 110 of the second preferred embodiment has dimensions similar to that of the first preferred embodiment for processing a 200 mm wafer. The upper and lower dome walls each have a thickness of about 5 mm and a constant radius of curvature of about 50 to 100 cm. The side rails 116a, 116b, 117a and 117b have a thickness preferably of about 5 mm and a vertical height of about 10 mm. The inlet and outlet flanges 118 and 120 have a height of about 30 mm and a thickness of about 15 mm, increasing to about 20 mm at the location of segments 126a, 126b and 126c. Each of the segments 126a and 126c has a thickness corresponding to the thickness of upper and lower dome walls 112 and 114, and thus, as illustrated, is about 5 mm. The central segment 126b and support plates 129a, 129b and 130 each has a thickness preferably of about 5 mm. The thickness of retaining beam is preferably about 30 to 40 mm (width)×20 mm (height), and the thickness of end flanges 140 and 142 is preferably about 30 mm.

It will be appreciated that other dimensions and proportions can be used for this embodiment without departing from the scope of the invention. Thus, the chamber may be made larger or smaller depending on the wafer size or number of wafers to be processed. Furthermore, the curvature of the dome walls may be varied depending on the desired strength and energy transmission characteristics. Modifications to the thicknesses of the walls and other design aspects of this chamber are also contemplated.

3. Third Preferred Embodiment

The chamber design described with respect to FIGS. 5–9 above can also be modified for designing a chamber having upper and lower walls curved in both the x-z and y-z planes, but with a generally rectangular shape when viewed from above. Referring to FIGS. 10–14, one embodiment of a reactor vessel or chamber 210 having substantially all-quartz interior surfaces for chemical vapor processing and the like is illustrated. As can be seen, the chamber 210 has an elongated, generally flattened configuration, with the walls of the chamber having a circular curvature with different radii in the x-z and y-z planes. Alternatively, other types of curvature may be used in the x-z and y-z planes, for example, toroidal, parabolic, hyperbolic, and elliptical curvatures. The chamber has an upper wall 212 with an outer convex surface and an inner concave surface, and a lower wall 214 with an outer convex surface and an inner concave surface. The walls 212 and 214 are connected by side walls, specifically lateral side rails 216 having curved upper and lower edges, an upstream inlet end flange 218 and a downstream outlet end flange 220.

The chamber height is desirably less than the chamber width in the illustrated embodiment. In this respect, a longitudinal direction for the chamber 210 extends from the inlet end flange 218 to the outlet end flange 220. A lateral direction extends between the side walls 216. The height direction is perpendicular to both the longitudinal and lateral axes. Looking at the end view of FIG. 14, the chamber 210 has a major dimension extending between the side walls 216, and a minor dimension extending between the apexes of the upper and lower walls 212, 214.

Figure 11:
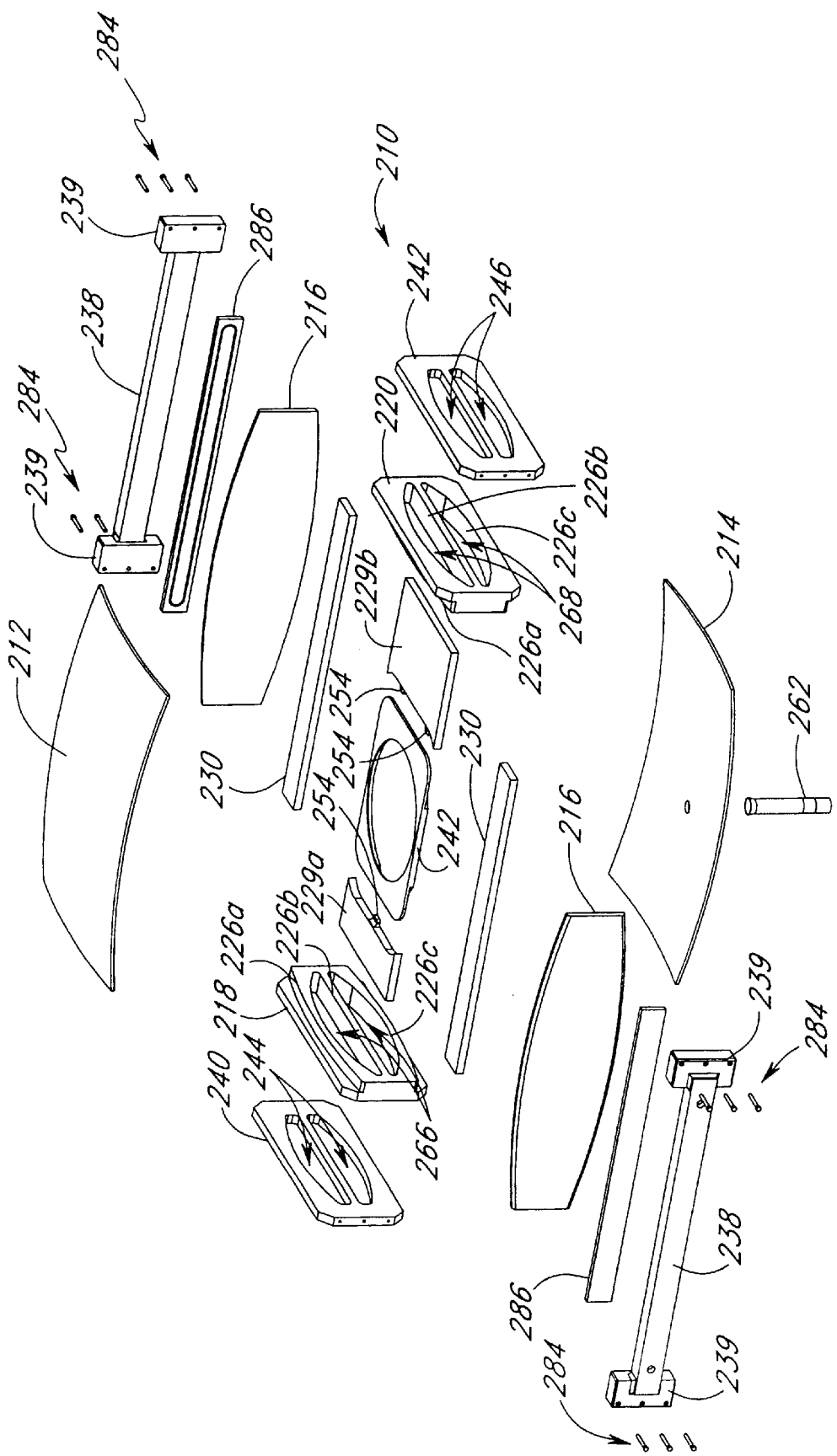
FIG. 11 is an exploded perspective view of the process chamber of FIG. 10.
Figure 12:
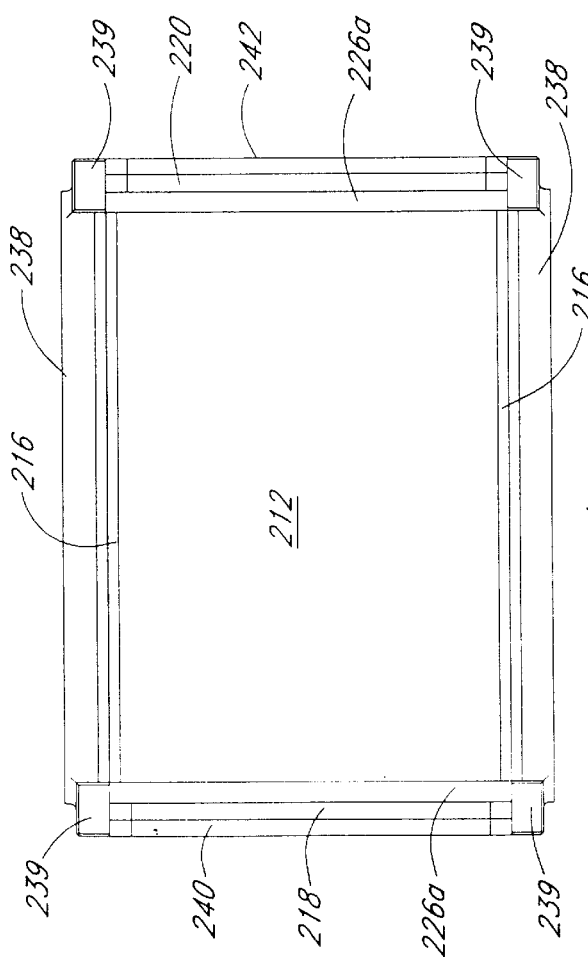
FIG. 12 is a top elevation view of the process chamber of FIG. 10.
Figure 14:
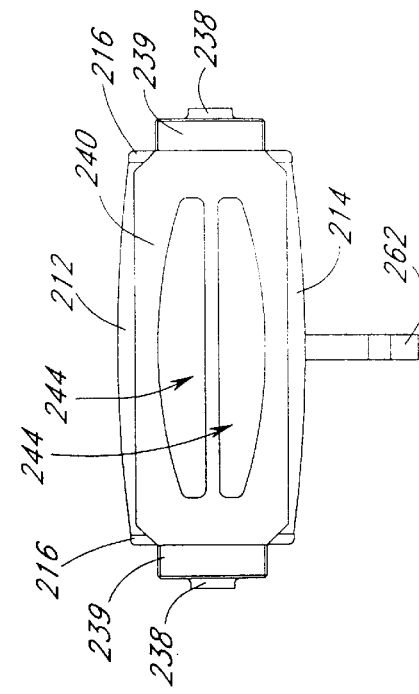
FIGS. 13 and 14 are side views of the process chamber of FIG. 10.
Figure 13:
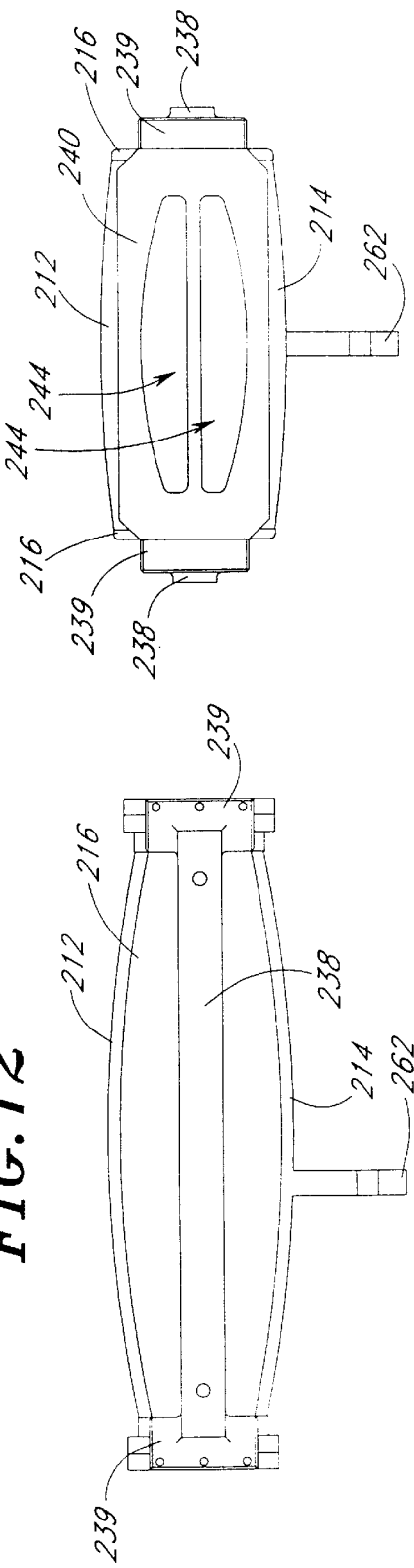

With reference to FIGS. 11 and 12, both the upper wall 212 and the lower wall 214 are thin, curved plate-like elements having a rectangular flat vertical projection. The walls 212 and 214 desirably are curved along both their longitudinal and lateral axes. The inlet flange 218 and outlet flanges 220 are each preferably rectangular in shape having chamfered corners. More particularly, the inner surfaces of the inlet and outlet flanges contain upper, middle and lower segments 226a, 226b and 226c, respectively, defining apertures 266 and 268 therebetween for wafer and gas inlet and outlet. The upper segments 226a are curved to mate with the curved upstream edges of the upper wall 212. Correspondingly, the lower segments 226c are curved to mate with the curved downstream edges of the lower wall 214. These segments are preferably joined to the upper and lower walls 212, 214 by welding. The middle segment 226b preferably precisely bisects the chamber.

As shown in FIG. 11, within the chamber 210, interior reinforcements are provided in the form of reinforcement plates 229a, 229b and 230. These support plates are preferably provided at all four sides of the interior of the chamber to form a continuous support along the interior edges of the chamber. The plates are preferably positioned to define an aperture within the plates for positioning of a susceptor (not shown) and a slip ring 242 therein. The slip ring is preferably supported on elbows 254. The slip ring, susceptor and related support structure have been described above.

More particularly, a substantially rectangular support plate 229a is preferably provided at the upstream end of the chamber and mates with middle segment 226b, preferably welded thereto. A similar downstream plate 229b is preferably welded to middle segment 226b of the outlet flange 220. Plates 230 are preferably provided along the lateral sides of the chamber, each having a substantially rectangular shape to mate with the shape of the side walls 216. These support plates are preferably welded to the upper and lower dome walls 212 and 214, and are also preferably welded to the upstream and downstream support plates 229a and 229b. As can be seen in FIG. 11, the downstream plate 229b is preferably sized to be larger than the upstream plate 129a, such that the aperture between the plates is centered closer to the upstream end of the chamber. It should be appreciated, however, that these plates may have the same size.

In the embodiment shown in FIGS. 10–14, the quartz side rails 216, as well as the inlet and outlet flanges 218 and 220, are surrounded by a retainer which confines expansion of the chamber due to pressure differential forces. More preferably, this chamber comprises retaining beams 238 provided on the lateral sides of the chamber, and end flanges 240 and 242, to confine the inlet and outlet flanges 218 and 220, respectively. The retaining beams 238 are preferably rectangular in shape and extend along the lateral sides of the chamber. At the upstream and downstream ends of these beams are flanges 239 adapted to connect with the upstream and downstream retainer flanges 240 and 242. In the preferred embodiment shown in FIG. 10, the beams 238 are attached to the flanges 240 and 242 using screws 284. However, the skilled artisan will readily appreciate that other joining methods may be used as well. In order to prevent excessive heat loss to the retaining beams 238, described below, a side panel 286 formed of bubble quartz can be inserted between the side walls 216 and beams 238, The retainer components 238, 240 and 242 are preferably made of a material having a high elastic modulus and high tensile strength, for example, stainless steel, aluminum alloys, or titanium alloys. Preferably, the inlet and outlet retainers 240 and 242 are substantially rectangular in shape with chamfered corners to correspond to the shape of the inlet and outlet flanges 218 and 220. The retainer also preferably has apertures 244 and 246 corresponding with the apertures 266 and 268 in inlet flanges 218 and 220 for gas and wafer inlet and outlet.

The chamber 210 used to process a 200 mm wafer preferably has a length of about 600 mm and a width of about 300 mm. The height of the chamber is about 50 mm at end flanges 240 and 242, increasing to a maximum height of about 100 mm at the apexes of the chamber between the upper and lower walls. The upper and lower walls 212 and 214 preferably have a thickness of about 5 mm, and side rails 216 preferably have a thickness of about 5 mm. The upper wall and lower wall preferably have a radius of curvature in the x-z plane of about 50 to 100 cm, and a radius of curvature in the y-z plane of about 100 to 150 cm. The inlet and outlet flanges 218 and 220 preferably have a thickness of about 15 mm, increasing to about 20 mm at the location of segments 226a, 226b and 226c. Each of the segments 226a and 226c has a thickness corresponding to the thickness of the upper and lower walls 212 and 214, and thus, as illustrated, is about 5 mm. Central segment 226b and support plates 229a, 229b and 230 each has a thickness of about 5 mm. Retaining beams 238 are preferably about 30 to 40 mm thick, and end flanges 240 and 242 are preferably about 30 mm thick. Other features of the chamber of FIGS. 10–14 have been described above and may also be found in the above-referenced PROCESS CHAMBER WITH INNER SUPPORT.

The chamber illustrated by FIGS. 10–14 has the advantage that by having a generally rectangular shape, when longitudinal gas flow is provided through the chamber, the gas has more room to spread out from the inlet end of the chamber than for chambers having a more cylindrical symmetrical configuration. On the other hand, the chambers of FIGS. 1–9, by providing a generally circular configuration, favor axial gas flow, conserve space, and are better suited to distribute stresses due to the low pressure environment.

Overall, each of the chambers described by FIGS. 1–14 advantageously encloses a chamber space having substantially an all-quartz interior surface. This construction conserves power necessary to heat the chamber because the all-quartz surfaces remain relatively cooler than chambers that have metallic surfaces. The all-quartz construction also minimizes fracturing of non-quartz parts due to the high temperature, low pressure environment. Furthermore, the all-quartz construction prevents O-rings and metals from being exposed to the reaction environment, while reducing the number of contaminants exposed to the interior of the chamber. The curvature of the upper and lower walls of these chambers, specifically the curvature in both the x-z and y-z planes, enables the chambers to withstand the stresses accompanying high temperature, low pressure processing.

Although the chambers of the preferred embodiments are particularly suited for chemical vapor deposition, other processes requiring clean ovens may benefit from the improved chamber. For example, annealing, etching, plasma-enhanced deposition, and other such processes may all utilize the present chamber in its essential form with appropriate modifications.

Although this invention has been described in terms of certain preferred embodiments, other embodiments that are apparent to those of ordinary skill in the art are also within the scope of this invention. Accordingly, the scope of the invention is intended to be defined by the claims that follow.

What is claimed is:

1. A processing chamber, comprising:
   an upper wall having a convex outer surface and a concave inner surface, the upper wall extending a length in a y dimension, a width in an x dimension and a height in a z dimension, wherein the upper wall is curved in both x-z and y-z planes;
   a lower wall spaced from the upper wall having a convex outer surface and a concave inner surface, the lower wall extending a length in the y dimension, a width in the x dimension and a height in the z dimension, wherein the lower wall is curved in both x-z and y-z planes;
   at least one side wall having an inner surface and an outer surface connecting the upper wall to the lower wall, wherein the upper wall, lower wall and the at least one side wall together substantially enclose a chamber space having all-quartz enclosing surfaces; and
   an external reinforcement provided on at least part of the outer surface of the at least one side wall to confine outward expansion of the chamber;
   wherein the upper wall is connected to the lower wall by a plurality of side walls.

2. The chamber of claim 1, wherein the upper and lower walls are generally circular when viewed from above.

3. The chamber of claim 1, wherein the upper wall is generally dome-shaped.

4. The chamber of claim 1, wherein the lower wall is generally dome-shaped.

5. The chamber of claim 2, wherein the upper wall is connected to the lower wall by a generally cylindrical side wall.

6. The chamber of claim 1, wherein the upper and lower walls are formed from transparent quartz.

7. A processing chamber, comprising:
   an upper wall having a convex outer surface and a concave inner surface, the upper wall extending a length in a y dimension, a width in an x dimension and a height in a z dimension, wherein the upper wall is curved in both x-z and y-z planes;
   a lower wall spaced from the upper wall having a convex outer surface and a concave inner surface, the lower wall extending a length in the y dimension, a width in the x dimension and a height in the z dimension, wherein the lower wall is curved in both x-z and y-z planes;
   at least one side wall having an inner surface and an outer surface connecting the upper wall to the lower wall, wherein the upper wall, lower wall and the at least one side wall together substantially enclose a chamber space having all-quartz enclosing surfaces; and
   an external reinforcement provided on at least part of the outer surface of the at least one side wall to confine outward expansion of the chamber;
   wherein the at least one side wall is formed from bubble quartz.

8. The chamber of claim 1, further comprising an interior reinforcement extending from an inner surface of the at least one side wall to resist outward deformation of at least one side wall and flattening deformation of the upper and lower walls where the chamber is subjected to an external pressure greater than the pressure within the chamber.

9. The chamber of claim 8, wherein the interior reinforcement extends around the entire internal perimeter of the chamber space.

10. The chamber of claim 9, wherein the interior reinforcement is an annular support plate.

11. The chamber of claim 9, wherein the interior reinforcement includes a plurality of support plates fixed to an inner surface of the at least one side wall.

12. A processing chamber, comprising:
    a quartz upper dome wall;
    a quartz lower dome wall spaced from the upper dome wall, each dome wall having a convex outer surface and a concave inner surface;
    a generally cylindrical quartz side wall having an inner surface and an outer surface connecting the upper and lower dome walls and defining a chamber space therebetween;
    a retainer surrounding at least a portion of the outer surface of the side wall to confine outward expansion of the chamber; and
    an interior reinforcement extending from the inner surface of the side wall;
    wherein the chamber space is substantially enclosed only by the inner surfaces of the dome wall and the inner surface of the side wall.

13. The chamber of claim 12, wherein the interior reinforcement is joined to the inner surface of the side wall.

14. The chamber of claim 12, wherein the interior reinforcement is an annular support plate.

15. The chamber of claim 12, wherein the retainer is metallic.

16. The chamber of claim 12, wherein the side wall includes an inlet flange having an opening to the chamber space to allow for the introduction of process gases and wafer insertion.

17. The chamber of claim 12, wherein the side wall includes an outlet flange open to the chamber space to allow for gas exhaust.

18. A processing chamber, comprising:
a quartz upper dome wall;
a quartz lower dome wall spaced from the upper dome wall, each dome wall having a convex outer surface and a concave inner surface;
a generally cylindrical quartz side wall having an inner surface and an outer surface connecting the upper and lower dome walls and defining a chamber space therebetween;
a retainer surrounding at least a portion of the outer surface of the side wall to confine outward expansion of the chamber; and
a gas inlet extending from the upper wall;
wherein the chamber space is substantially enclosed only by the inner surfaces of the dome wall and the inner surface of the side wall.

19. The chamber of claim 12, wherein the inner surfaces between the dome walls and the side wall are substantially flush.

20. A processing chamber having an upstream end and a downstream end and lateral sides extending therebetween, the chamber comprising:
an upper wall and a lower wall spaced from the upper wall, each wall being outwardly curved in both a lateral and a longitudinal direction; and
a plurality of side walls connecting the upper and lower walls, including:
an inlet flange connecting the upper and lower walls at the upstream. end of the chamber;
an outlet flange connecting the upper and lower walls at the downstream end of the chamber; and
side rails connecting the upper and lower walls at the lateral sides of the chamber and connecting the inlet and outlet flanges between the upstream and downstream ends of the chamber; and
an external reinforcement provided along at least a portion of the plurality of side walls to confine outward expansion of the chamber;
wherein the chamber has a substantially all-quartz interior surface defined by the upper and lower walls and the plurality of side walls.

21. The chamber of claim 20, wherein the upper and lower walls have lateral edges and are generally circular when viewed from above.

22. The chamber of claim 21, wherein the side rails are outwardly curved to mate with the lateral edges of the upper and lower walls.

23. The chamber of claim 20, wherein an upper and lower side rail is provided at each lateral side of the chamber, each upper side rail extending from the upper wall and each lower side rail extending from the lower wall, and wherein the upper and lower side rails are joined together.

24. The chamber of claim 20, wherein the upper and lower walls are substantially circular when viewed from above.

25. The chamber of claim 24, wherein the upstream and downstream edges of the upper and lower walls appear straight when viewed from above and are outwardly curved in the vertical dimension.

26. The chamber of claim 20, further comprising an internal reinforcement extending from the interior surface of the chamber.

27. The chamber of claim 26, wherein the internal reinforcement includes a plurality of support plates joined to and extending inwardly from the inlet and outlet flanges.

28. The chamber of claim 26, wherein the internal reinforcement includes a plurality of support plates joined to and extending inwardly from the side rails.

29. The chamber of claim 20, wherein the external reinforcement includes:
retaining beams extending along the lateral sides of the chamber; and
end flanges mating with the inlet and outlet flanges.

30. A chamber for processing semiconductor wafers and the like, the chamber comprising:
outwardly convex upper and lower walls each having outer and inner surfaces and being curved in a lateral and a longitudinal direction; and
at least one side wall connecting the upper and lower walls, the at least one side wall having inner surfaces that are substantially flush with the inner surfaces of the upper and lower walls at the connection between the edges of the at least one side wall and the upper and lower walls, the upper and lower walls and the at least one side wall enclosing a chamber space having a substantially continuous inner surface formed of a nonreactive substantially light-transmissive material;
wherein the at least one side wall is made of translucent quartz.

31. The chamber of claim 30, wherein the inner surface of the chamber space is formed of quartz.

32. The chamber of claim 31, wherein the upper and lower walls are made of transparent quartz.

33. The chamber of claim 31, wherein the upper and lower walls are substantially dome-shaped and the at least one side wall is generally cylindrical.

34. A processing chamber, comprising:
an upper wall and a lower wall that are both curved in x-z and y-z planes;
at least one side wall connecting the upper and lower walls such that the at least one side wall and the upper and lower walls confine a chamber space; and
a reinforcement extending along the entire interior perimeter of the chamber space to prevent outward expansion of the chamber.

35. The chamber of claim 34, wherein the reinforcement includes at least one support plate joined to an inner surface of the chamber.

36. The chamber of claim 35, wherein the at least one support plate is an annular support.

37. The chamber of claim 35, wherein a plurality of support plates defines an opening therein.

38. A processing chamber having an upstream end and a downstream end defining a longitudinal axis of the chamber, and a lateral axis perpendicular to the longitudinal axis, the chamber comprising:
outwardly curved upper and lower walls, each wall being substantially rectangular when viewed from above, wherein each wall is outwardly curved along both its longitudinal and lateral axes; and
side walls connecting the upper and lower walls, wherein the side walls are substantially flat plates.

39. The chamber of claim 38, wherein the side walls extend vertically between the upper and lower walls.

40. The chamber of claim 39, wherein the side walls include an inlet flange at the upstream end and an outlet flange at the downstream end.

41. The chamber of claim 40, wherein the inlet and outlet flanges each have upwardly and downwardly curved segments to mate with the upper and lower dome walls.

42. The chamber of claim 38, wherein the side walls include lateral side rails having upper and lower curved edges to mate with the upper and lower walls.

43. The chamber of claim 41, further comprising an internal reinforcement extending continuously along the internal perimeter of the chamber.

44. The chamber of claim 43, wherein the internal reinforcement comprises at least one support plate extending from an inner surface of the side walls.

45. A processing chamber having an upstream end and a downstream end and lateral sides extending therebetween, comprising:

an upper wall extending a length in a y dimension between the upstream and downstream ends, a width in an x dimension between the lateral sides, and a height in a z dimension, the upper wall having a substantially convex outer surface and being formed of a substantially non-reactive light transmissive material;

a lower wall extending a length in the y dimension, a width in the x dimension, and a height in the z dimension, the lower wall having a substantially convex outer surface and being formed of a substantially non-reactive light transmissive material;

at least one side wall connecting the upper wall to the lower wall to define a chamber space therebetween, the at least one side wall defining an outer periphery of the chamber space and being formed of a substantially non-reactive light transmissive material; and an external reinforcement extending substantially entirely around the outer periphery of the chamber space to confine outward expansion of the chamber;

wherein the at least one side wall is made of translucent quartz.

46. The chamber of claim 45, wherein the external reinforcement is made of metal.

47. The chamber of claim 45, wherein the upper wall and the lower wall are made of substantially transparent quartz.

48. The chamber of claim 45, wherein the upper and lower walls are substantially circular when viewed from above.

49. The chamber of claim 45, wherein the upper and lower walls are substantially rectangular when viewed from above.

50. A processing chamber having an upstream end and a downstream end and lateral sides extending therebetween, comprising:

an upper wall extending a length in a y dimension between the upstream and downstream ends, a width in an x dimension between the lateral sides, and a height in a z dimension, the upper wall having a substantially convex outer surface and being formed of a substantially non-reactive light transmissive material;

a lower wall extending a length in the y dimension, a width in the x dimension, and a height in the z dimension, the lower wall having a substantially convex outer surface and being formed of a substantially non-reactive light transmissive material;

at least one side wall connecting the upper wall to the lower wall to define a chamber space therebetween, the at least one side wall defining an outer periphery of the chamber space and being formed of a substantially non-reactive light transmissive material; and an external reinforcement extending substantially entirely around the outer periphery of the chamber space to confine outward expansion of the chamber;

wherein the at least one side wall includes a pair of side rails at the lateral sides of the chamber, an inlet flange at the upstream end of the chamber and an outlet flange at the downstream end of the chamber.

51. The chamber of claim 50, wherein the external reinforcement includes retaining beams at the lateral sides of the chamber and retaining flanges at the upstream and downstream ends of the chamber.

52. The chamber of claim 45, wherein the upper and lower walls have outer surface that are outwardly curved in x-z and y-z planes.

53. A processing chamber having an upstream end and a downstream end and lateral sides extending therebetween, comprising:

an upper wall extending a length in a y dimension between the upstream and downstream ends, a width in an x dimension between the lateral sides, and a height in a z dimension, the upper wall having a substantially convex outer surface and being formed of a substantially non-reactive light transmissive material;

a lower wall extending a length in the y dimension, a width in the x dimension, and a height in the z dimension, the lower wall having a substantially convex outer surface and being formed of a substantially non-reactive light transmissive material;

at least one side wall connecting the upper wall to the lower wall to define a chamber space therebetween, the at least one side wall defining an outer periphery of the chamber space and being formed of a substantially non-reactive light transmissive material;

an external reinforcement extending substantially entirely around the outer periphery of the chamber space to confine outward expansion of the chamber; and an interior reinforcement connected to the at least one side wall at the outer periphery of the chamber space to resist outward deformation of the at least one side wall and flattening deformation of the upper and lower walls when the chamber is subjected to an external pressure greater than the pressure within the chamber.

54. The chamber of claim 53, wherein the interior reinforcement is an annular support plate.

* * * * *

UNITED STATES PATENT AND TRADEMARK OFFICE
CERTIFICATE OF CORRECTION

PATENT NO.    : 6,383,330 B1
DATED         : May 7, 2002
INVENTOR(S)   : Ivo Raaijmakers It is certified that error appears in the above-identified patent and that said Letters Patent is hereby corrected as shown below:

Column 19,
Line 1, please amend Claim 43 to read:

43.   A processing chamber having an upstream end and a downstream end defining a longitudinal axis of the chamber, and a lateral axis perpendicular to the longitudinal axis, the chamber comprising:
    outwardly curved upper and lower walls, each wall being substantially rectangular when viewed from above, wherein each wall is outwardly curved along both its longitudinal and lateral axes; and
    side walls connecting the upper and lower walls; and
    an internal reinforcement extending continuously along the internal perimeter of the chamber.

Signed and Sealed this

Second Day of December, 2003

JAMES E. ROGAN
*Director of the United States Patent and Trademark Office*